United States Patent
Chiu

(10) Patent No.: US 10,170,179 B2
(45) Date of Patent: Jan. 1, 2019

(54) DATA STORAGE DEVICE AND OPERATING METHOD FOR DATA STORAGE DEVICE

(71) Applicant: Silicon Motion, Inc., Jhubei, Hsinchu County (TW)

(72) Inventor: Shen-Ting Chiu, Houlong Township, Miaoli County (TW)

(73) Assignee: SILICON MOTION, INC., Jhubei, Hsinchu County (TW)

( * ) Notice: Subject to any disclaimer, the term of this patent is extended or adjusted under 35 U.S.C. 154(b) by 0 days.

(21) Appl. No.: 15/861,018

(22) Filed: Jan. 3, 2018

(65) Prior Publication Data

US 2018/0286477 A1     Oct. 4, 2018

(30) Foreign Application Priority Data

Mar. 28, 2017 (TW) .............................. 106110278 A

(51) Int. Cl.
  *G11C 11/00* (2006.01)
  *G11C 11/56* (2006.01)
  *G06F 3/06* (2006.01)
  *G11C 16/10* (2006.01)

(52) U.S. Cl.
  CPC .......... *G11C 11/5628* (2013.01); *G06F 3/061* (2013.01); *G06F 3/064* (2013.01); *G06F 3/0655* (2013.01); *G06F 3/0679* (2013.01); *G11C 16/10* (2013.01)

(58) Field of Classification Search
  None
  See application file for complete search history.

(56) References Cited

U.S. PATENT DOCUMENTS

| | | | |
|---|---|---|---|
| 2012/0144093 A1* | 6/2012 | Steiner | G06F 12/0246 711/103 |
| 2014/0229656 A1* | 8/2014 | Goss | G06F 12/0246 711/103 |
| 2015/0169228 A1 | 6/2015 | Sivasankaran et al. | |
| 2015/0199140 A1 | 7/2015 | Chen et al. | |
| 2016/0162215 A1 | 6/2016 | Jayarama et al. | |
| 2016/0180959 A1 | 6/2016 | Darragh et al. | |
| 2017/0060461 A1 | 3/2017 | Erez et al. | |

FOREIGN PATENT DOCUMENTS

TW     I525625 B     3/2016

* cited by examiner

*Primary Examiner* — Matthew Bradley
*Assistant Examiner* — Craig S Goldschmidt
(74) *Attorney, Agent, or Firm* — McClure, Qualey & Rodack, LLP

(57) ABSTRACT

A data storage device with optimized write operations is provided. A data storage device uses a flash memory having K dies. Each die has N planes. Each plane has multiple blocks. Each block has multiple pages. Within one block, each word line is shared by M pages. K, N and M are integers larger than 1. The controller of the data storage device writes first L pages of data that a host issues in order into L pages of a first die. L is M*N. The L pages of the first die are provided by N planes of the first die with each plane of the first die using one block to provide M pages sharing the same word line. The first L pages of data are written to the N planes of the first die in an interleaved way.

20 Claims, 5 Drawing Sheets

|        | P0 | P1 |     | P0 | P1 |     | P0 | P1 |     | P0 | P1 |
|--------|----|----|-----|----|----|-----|----|----|-----|----|----|
| Page 0 | 0  | 1  |     | 4  | 5  |     | 8  | 9  |     | 12 | 13 |
| Page 1 | 2  | 3  |     | 6  | 7  |     | 10 | 11 |     | 14 | 15 |
| Page 2 | 16 | 17 |     | 20 | 21 |     | 24 | 25 |     | 28 | 29 |
| Page 3 | 18 | 19 |     | 22 | 23 |     | 26 | 27 |     | 30 | 31 |
| Page 511 | …… | …… |   | …… | …… |     | …… | …… |     | …… | …… |
|        | Die 0 |  |     | Die 1 |  |     | Die 2 |  |     | Die 3 |  |

FIG. 3A

|      | P0 | P1 | P2 | P3 | P4 | P5 | P6 | P7 |
|------|----|----|----|----|----|----|----|----|
| Page 0 | 0 | 1 | 6 | 7 | 12 | 13 | 18 | 19 |
| Page 1 | 2 | 3 | 8 | 9 | 14 | 15 | 20 | 21 |
| Page 2 | 4 | 5 | 10 | 11 | 16 | 17 | 22 | 23 |
| ... | ... | ... | ... | ... | ... | ... | ... | ... |
| Page 511 | | | | | | | | |
| | Die 0 | | Die 1 | | Die 2 | | Die 3 | |

FIG. 4

DATA STORAGE DEVICE AND OPERATING METHOD FOR DATA STORAGE DEVICE

CROSS REFERENCE TO RELATED APPLICATIONS

This Application claims priority of Taiwan Patent Application No. 106110278, filed on Mar. 28, 2017, the entirety of which is incorporated by reference herein.

BACKGROUND OF THE INVENTION

Field of the Invention

The present invention relates to data storage devices using flash memories as the storage medium.

Description of the Related Art

Flash memories are often used as the storage medium in today's data storage devices. Flash memories are often used in memory cards, USB flash devices, SSDs and other products. There is also an application that is a multi-chip package that wraps flash memory with its controller, called an embedded flash memory module (e.g., an eMMC).

When updating the data in a flash memory, the new data is stored in a spare space rather than being overwritten on the space storing old data. The old data should be regarded as invalid data after the data is updated. Frequent write operations may easily fill the storage space with invalid data. The space of the flash memory, therefore, is not ideally utilized. How to optimize the write operations on a flash memory is an important issue in this technological field.

BRIEF SUMMARY OF THE INVENTION

A data storage device in accordance with an exemplary embodiment of the disclosure includes a flash memory and a controller. The flash memory includes K dies. Each die contains N planes. Each plane contains a plurality of blocks. Each block contains a plurality of pages. Each word line is shared by M pages within the same block. K, N and M are integers greater than 1. The controller writes a first patch of data that contains L pages issued by a host to L pages of a first die of the K dies. L is a product of N and M. The L pages of the first die are provided by N planes of the first die with each plane of the first die using one block to provide M pages sharing the same word line. The L pages contained in the first patch of data are written to the N planes of the first die in an interleaved way.

In another exemplary embodiment, a method for operating a data storage device is disclosed, by which a first patch of data that contains L pages issued by a host is written to L pages of a first die of K dies of a flash memory. Each die contains N planes. Each plane contains a plurality of blocks. Each block contains a plurality of pages. Each word line is shared by M pages within the same block. Each of K, N and M is an integer greater than 1. L is a product of N and M. The L pages of the first die are provided by N planes of the first die with each plane of the first die using one block to provide M pages sharing the same word line. The L pages contained in the first patch of data are written to the N planes of the first die in an interleaved way.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIG. 3A depicts the order that the dies Die0 to Die3 receive data, wherein a MLC technique is used;

FIG. 4 depicts the order that the dies Die0 to Die3 receive data, wherein a TLC technique is used.

DETAILED DESCRIPTION OF THE INVENTION

The following description shows exemplary embodiments of carrying out the invention. This description is made for the purpose of illustrating the general principles of the invention and should not be taken in a limiting sense. The scope of the invention is best determined by reference to the appended claims.

Figure 1A:
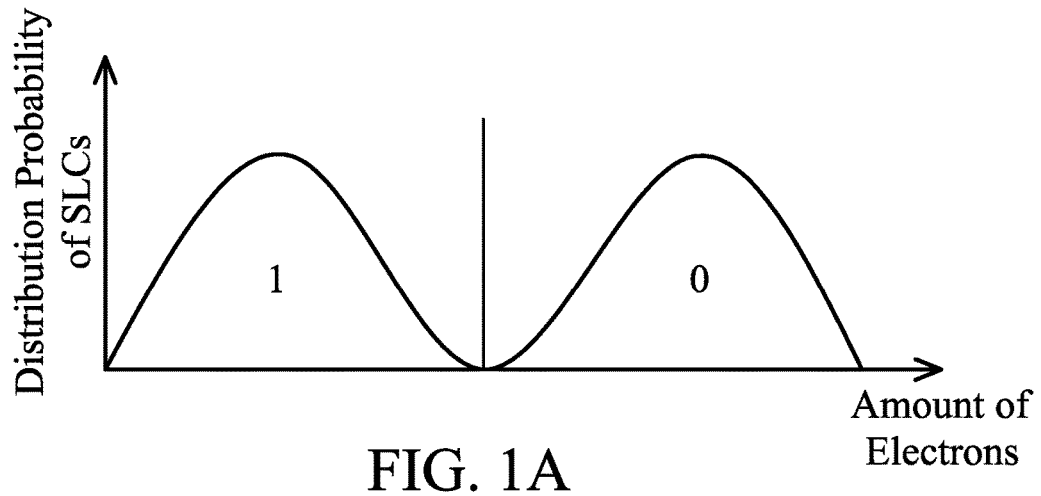
FIGS. 1A, 1B and 1C illustrate the distribution probability of storage cells for SLC, MLC and TLC techniques, respectively, with the logical meanings changed by modifying the floating gate electrons.
Figure 1B:
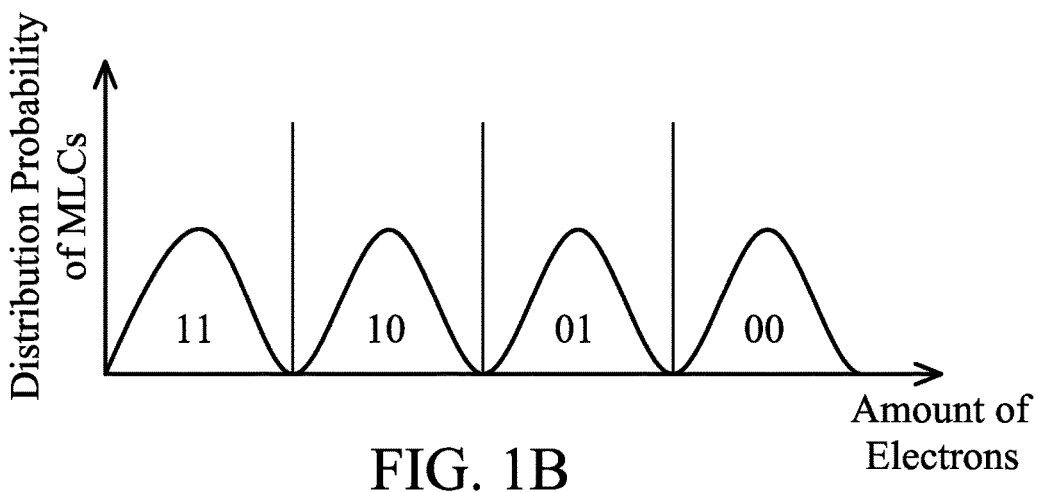
Figure 1C:
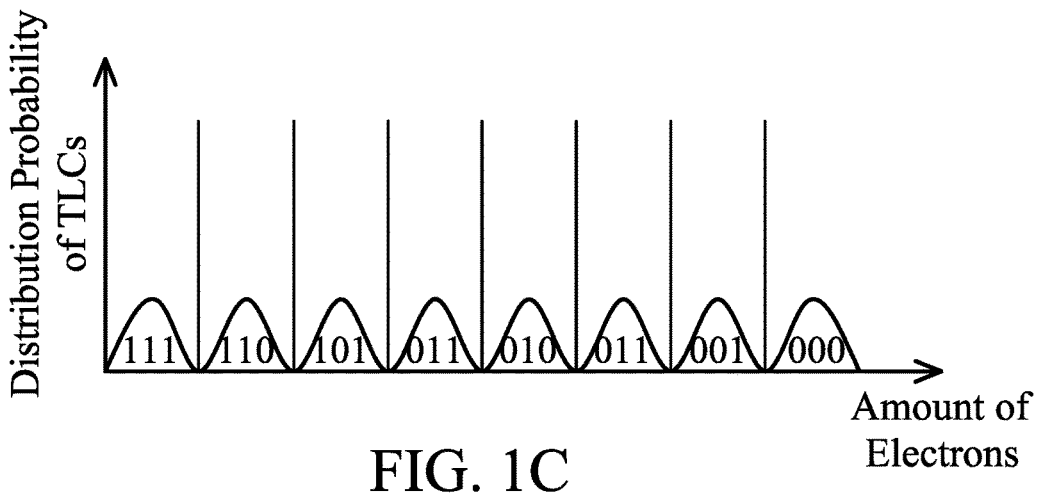

Various storage cells may be used in a flash memory. A single level cell (SLC) stores one single bit. A multiple level cell (MLC) stores two bits. A triple level cell (TLC) stores three bits. FIGS. 1A, 1B and 1C illustrate the distribution probability of storage cells for SLC, MLC and TLC techniques, respectively, with the logical meanings changed by modifying the floating gate electrons.

Regarding the SLCs, each storage cell stores one bit of data. Each word line is used to control a particular page. Regarding the MLCs, each storage cell stores two bits of data. The same word line is shared by two pages. Regarding the TLCs, each storage cell stores three bits of data. The same word line is shared by three pages. The disclosure aims at optimizing the usage of all pages activated by each word line.

Figure 2:
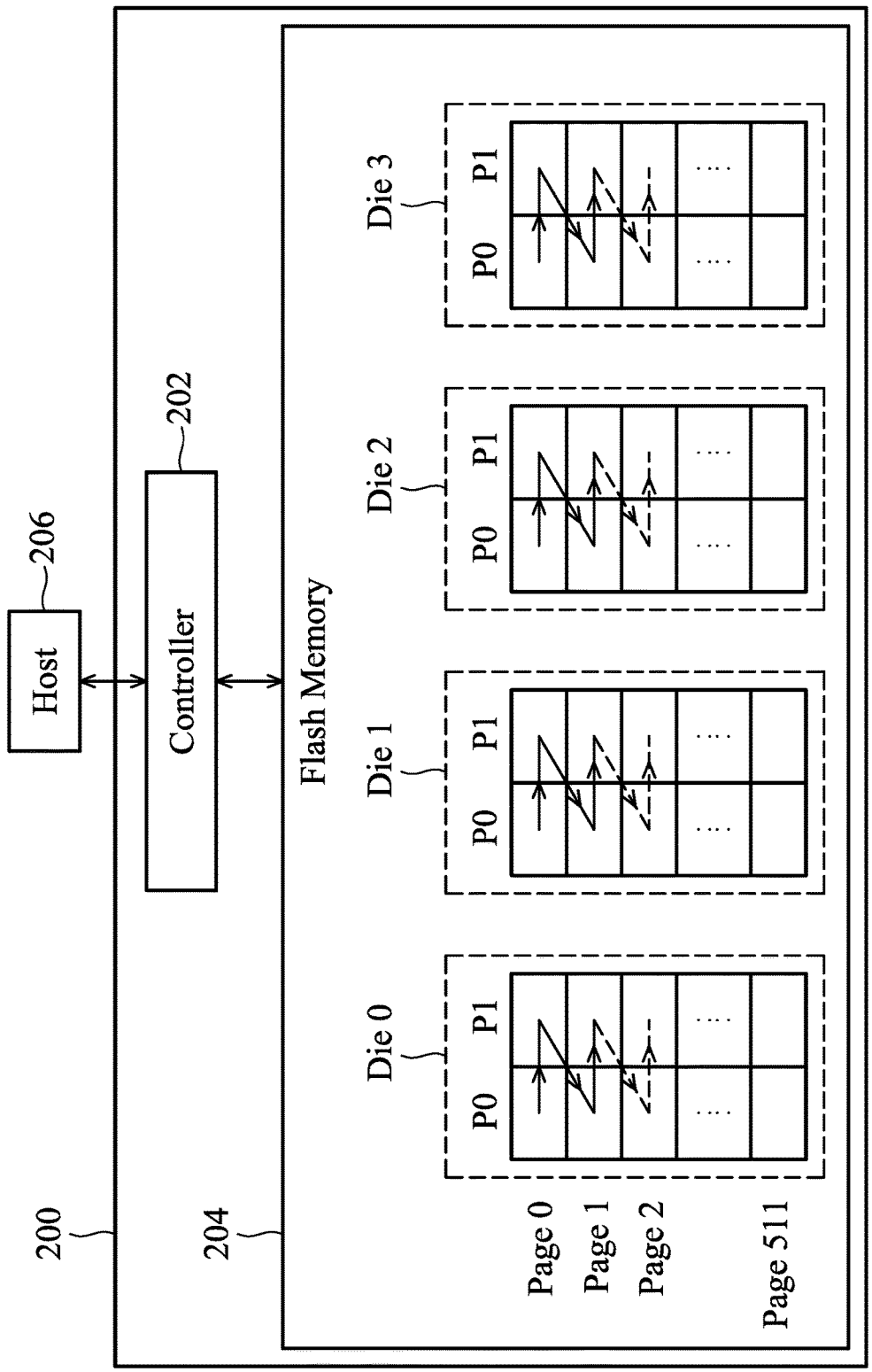
FIG. 2 depicts a data storage device 200 in accordance with an exemplary embodiment of the disclosure.

FIG. 2 depicts a data storage device 200 in accordance with an exemplary embodiment of the disclosure, which includes a controller 202 and a flash memory 204. Through the controller 202, a host 206 accesses the flash memory 204.

The flash memory 204 comprises multiple dies Die0, Die1, Die2 and Die3. Each die contains two planes (P0 and P1 in each die). Each plane is further divided into blocks. Each block contains a plurality of pages. In FIG. 2, for simplicity, only one block is depicted in each die. Each block comprises a plurality of pages numbered from 0 to 511 (i.e. Page0 to Page511).

The data issued by the host 206 is written to the flash memory 204 by the controller 202 in an optimized manner. The MLCs each store two bits of data are discussed here. The controller 202 writes four pages of data to four pages of the different planes of the same die with each plane providing two pages that share the same word line to store the write data. The four pages are written to the different planes in an interleaved way. Referring to die Die0, pages Page0 and Page1 contained in the depicted block of plane P0 are controlled by the same word line, and pages Page0 and Page1 contained in the depicted block of plane P1 are controlled by the same word line. The four pages of data sequentially output from the host 206 are written to page Page0 of plane P0 of die Die0, page Page0 of plane P1 of die Die0, page Page1 of plane P0 of die Die0 and page Page1 of plane P1 of die Die0 in order. The other dies (Die1 to Die3) are operated in the similar manner. As shown by the solid lines, data is written into each die in a Z-shaped manner. Data is written to one die in the Z-shaped manner in one shot (e.g., by one operation). The space of the flash memory 204 to be written data in the Z-shaped manner is effectively utilized. The controller 202 may provide a buffer (SRAM or DRAM) to collect the one-shot write data for each die. When less than four pages are collected to be written into a die in one shot, only the end of the corresponding z-shaped space is not used. Because data is written into the different planes in the interleaved way, the final two pages of a z-shaped space damaged in an unexpected power-off event do not affect the first two pages of the z-shaped space.

The TLCs that each store three bits of data are discussed here. The controller 202 writes six pages of data to six pages of the different planes of the same die with each plane providing three pages that share the same word line to store the write data. The six pages are written to the different planes in an interleaved way. Referring to die Die0, pages Page0, Page1 and Page2 contained in the depicted block of plane P0 are controlled by the same word line, and pages Page0, Page1 and Page2 contained in the depicted block of plane P1 are controlled by the same word line. The six pages of data sequentially output from the host 206 are written to page Page0 of plane P0 of die Die0, page Page0 of plane P1 of die Die0, page Page1 of plane P0 of die Die0, page Page1 of plane P1 of die Die0, page Page2 of plane P0 of die Die0 and page Page2 of plane P1 of die Die0 in order. The other dies (Die1 to Die3) are operated in the similar manner. As depicted by the solid plus dotted lines, data is written into each die in a serrated-shaped (double z-shaped) manner. Data is written to one die in the serrated-shaped manner in one shot (e.g., by one operation). The space of the flash memory 204 to be written data in the serrated-shaped manner is effectively utilized. When less than six pages are collected to be written into a die in one shot, only the end of the serrated-shaped space is not used. Because data is written into the different planes in the interleaved way, the final two (or four) pages of a serrated-shaped space damaged in an unexpected power-off event do not affect the first four (or two) pages of the serrated-shaped space.

FIG. 3A depicts the order that the dies Die0 to Die3 receive data, wherein a MLC technique is used. The data issued by the host 206 are numbered in chronological order. 32 pages of data are numbered from 0 to 31. The controller 202 writes four pages of data numbered from 0 to 3 to die Die0 in the z-shaped manner in one shot, another four pages of data numbered from 4 to 7 to die Die1 in the z-shaped manner in one shot, another four pages of data numbered from 8 to 11 to die Die2 in the z-shaped manner in one shot, another four pages of data numbered from 12 to 15 to die Die3 in the z-shaped manner in one shot, another four pages of data numbered from 16 to 19 to die Die0 in the z-shaped manner in one shot, another four pages of data numbered from 20 to 23 to die Die1 in the z-shaped manner in one shot, another four pages of data numbered from 24 to 27 to die Die2 in the z-shaped manner in one shot, and another four pages of data numbered from 28 to 31 to die Die3 in the z-shaped manner in one shot.

Figure 3B:
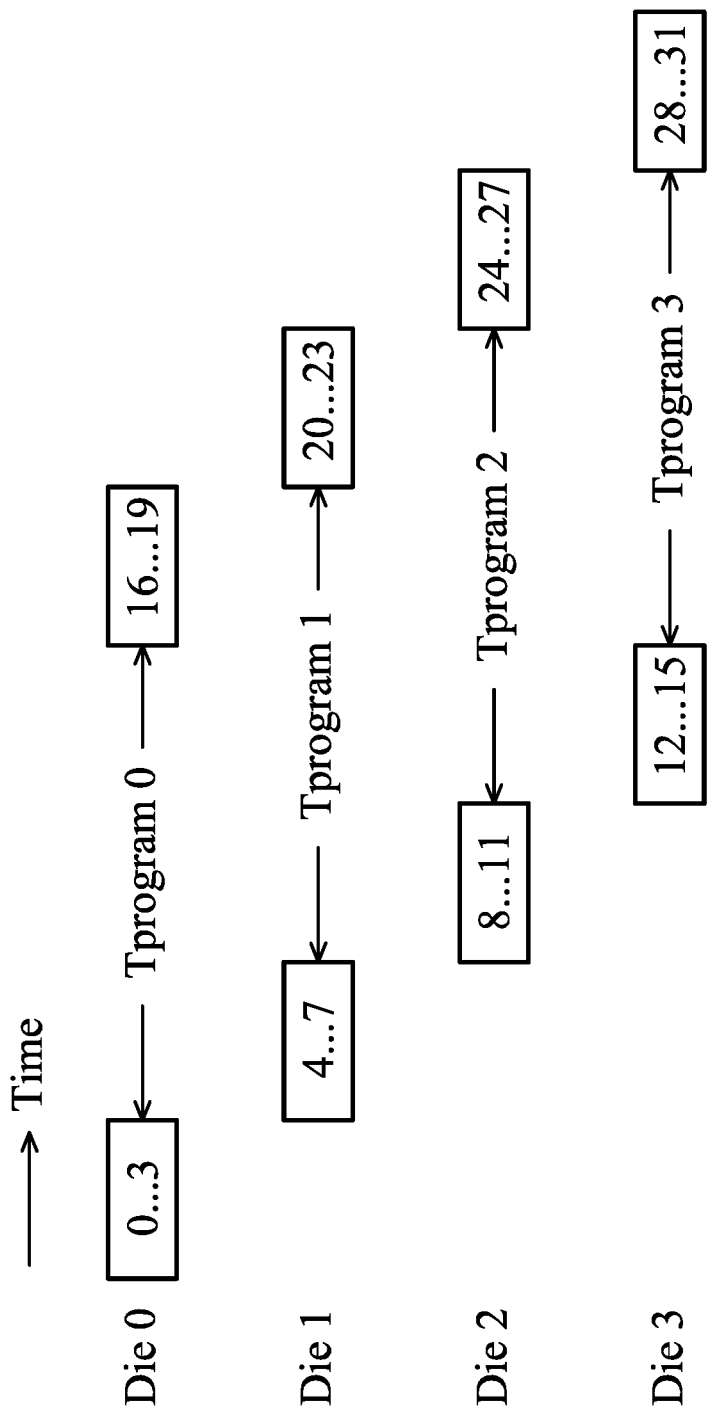
FIG. 3B is a timing diagram depicting how the 32 pages of data are written to the dies Die0 to Die3.

FIG. 3B is a timing diagram depicting how the 32 pages of data are written to the dies Die0 to Die3. Because the different dies may be programmed in parallel, a program period Tprogram0 (for the four pages of data numbered from 0 to 3), a program period Tprogram1 (for the four pages of data numbered from 4 to 7), a period Tprogram2 (for the four pages of data numbered from 8 to 11) and a period Tprogram3 (for the four pages of data numbered from 12 to 15) may overlap. As shown, the 16 pages of data (numbered from 0 to 15) issued by the host 206 are written to the flash memory 204 almost without any delay. The following 16 pages of data numbered from 16 to 31 are immediately programmed to the flash memory 204 after first 16 pages of data (numbered from 0 to 15).

Figure 4:
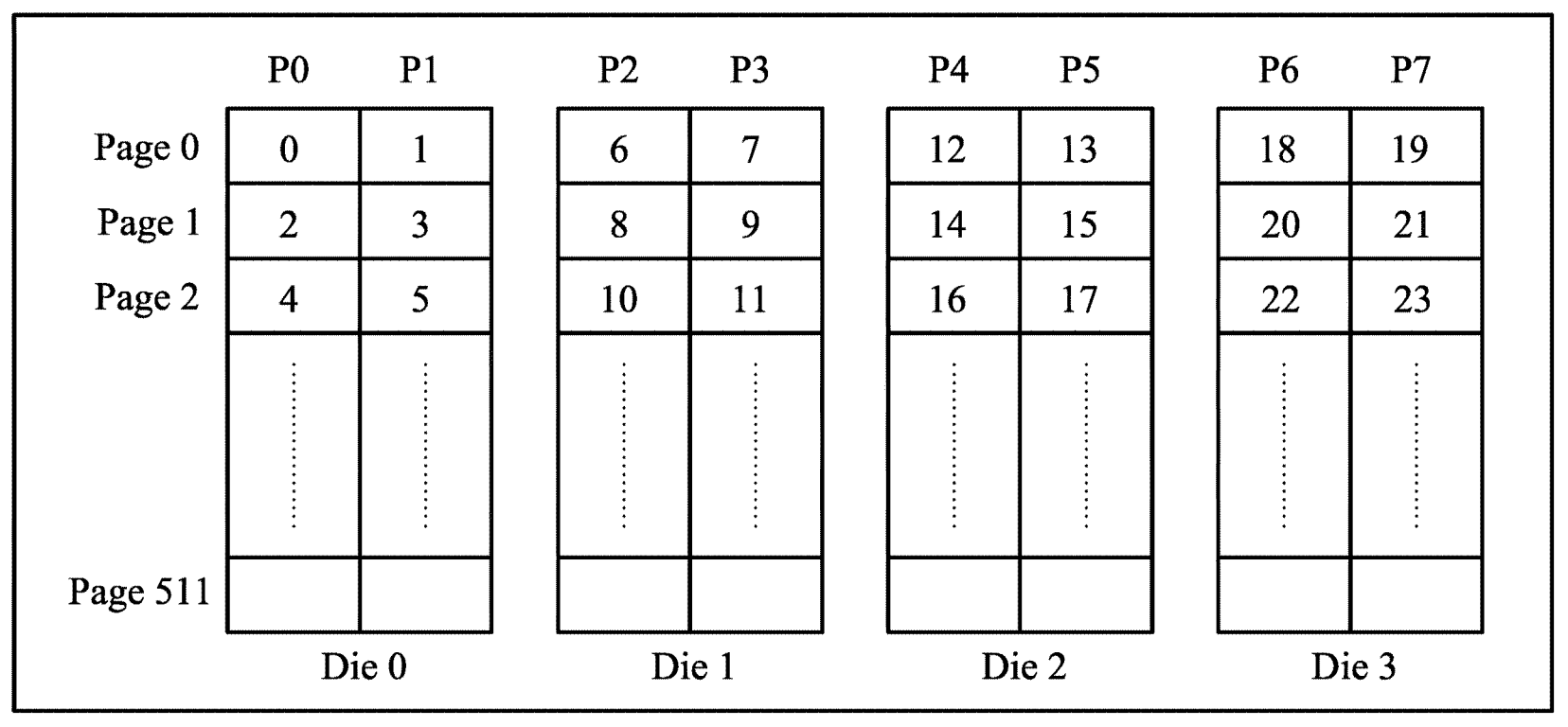

FIG. 4 depicts the order that the dies Die0 to Die3 receive data, wherein a TLC technique is used. The data issued by the host 206 are numbered in chronological order. 24 pages of data are numbered from 0 to 23. The controller 202 writes six pages of data numbered from 0 to 5 to die Die0 in the serrated-shaped manner in one shot, another six pages of data numbered from 6 to 11 to die Die1 in the serrated-shaped manner in one shot, another six pages of data numbered from 12 to 17 to die Die2 in the serrated-shaped manner in one shot, and another six pages of data numbered from 18 to 23 to die Die3 in the serrated-shaped manner in one shot. Similarly, the 24 pages of data may be written to the dies Die0 to Die3 almost without any delay.

In other exemplary embodiments, the number of dies is not limited to 4 (i.e., K may be any integer greater than 1), the number of planes in each die is not limited to 2 (i.e., N may be any integer greater than 1), and the number of bits stored in each storage cell is not limited to 2 or 3 (i.e., M may be any integer greater than 1). Other memory designs with the aforementioned optimized write operations are within the scope of the disclosure. Based on the above contents, the present invention further relates to methods for operating a data storage device.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
   a flash memory, including K dies, wherein each die contains N planes, each plane contains a plurality of blocks, each block contains a plurality of pages, each word line is shared by M pages within the same block, and each of K, N and M is an integer greater than 1; and
   a controller, writing a first patch of data that contains L pages issued by a host to L pages of a first die of the K dies, wherein L is a product of N and M, the L pages of the first die are provided by N planes of the first die with each plane of the first die using one block to provide M pages sharing the same word line, and the L pages contained in the first patch of data are written to the N planes of the first die in an interleaved way.

2. The data storage device as claimed in claim 1, wherein:
   the controller writes a second patch of data that contains L pages to L pages of a second die of the K dies, wherein the second patch of data is issued by the host after the first patch of data; and
   the L pages of the second die are provided by N planes of the second die with each plane of the second die using one block to provide M pages sharing the same word line, and the L pages contained in the second patch of data are written to the N planes of the second die in an interleaved way.

3. The data storage device as claimed in claim 2, wherein:
the controller writes (K−2) patches of data sequentially issued by the host to (K−2) dies of the K dies, wherein the (K−2) patches of data include a third to a $K_{th}$ patch of data and are sequentially issued by the host after the second patch of data, the (K−2) dies include a third to a $K_{th}$ die, each patch of the third to $K_{th}$ patches of data contains L pages, and the third to $K_{th}$ patches of data are stored to the third to $K_{th}$ dies, respectively; and
in any die between the third to $K_{th}$ dies, L pages contained in the corresponding patch of data are written to N planes in an interleaved way, and each plane uses one block to provide M pages sharing the same word line to store M pages of data.

4. The data storage device as claimed in claim 3, wherein:
the controller writes a $(K+1)_{th}$ patch of data that contains L pages to another L pages of the first die, wherein the $(K+1)_{th}$ patch of data is issued by the host after the $K_{th}$ patch of data.

5. The data storage device as claimed in claim 1, wherein:
the controller writes L pages scattered in N blocks in different planes of one die in one shot with each block providing M pages sharing the same word line.

6. The data storage device as claimed in claim 1, wherein:
the flash memory provides multiple level cells to store data and each word line is shared by two pages within the same block.

7. The data storage device as claimed in claim 6, wherein:
N, the number of planes within each die, is 2; and
K, the number of dies, is 4.

8. The data storage device as claimed in claim 1, wherein:
the flash memory provides triple level cells to store data and each word line is shared by three pages within the same block.

9. The data storage device as claimed in claim 8, wherein:
N, the number of the planes within each die, is 2; and
K, the number of dies, is 4.

10. The data storage device as claimed in claim 1, wherein:
the controller writes each die in a z-shaped manner or a serrated-shaped manner.

11. A method for operating a data storage device, comprising:
writing a first patch of data that contains L pages issued by a host to L pages of a first die of K dies of a flash memory, wherein each die contains N planes, each plane contains a plurality of blocks, each block contains a plurality of pages, each word line is shared by M pages within the same block, and each of K, N and M is an integer greater than 1; and
setting L, a number, to be a product of N and M, wherein:
the L pages of the first die are provided by N planes of the first die with each plane of the first die using one block to provide M pages sharing the same word line; and
the L pages contained in the first patch of data are written to the N planes of the first die in an interleaved way.

12. The method as claimed in claim 11, further comprising:
writing a second patch of data that contains L pages to L pages of a second die of the K dies, wherein the second patch of data is issued by the host after the first patch of data,
wherein:
the L pages of the second die are provided by N planes of the second die with each plane of the second die using one block to provide M pages sharing the same word line; and
the L pages contained in the second patch of data are written to the N planes of the second die in an interleaved way.

13. The method as claimed in claim 12, further comprising:
writing (K−2) patches of data sequentially issued by the host to (K−2) dies of the K dies, wherein the (K−2) patches of data include a third to a $K_{th}$ patch of data and are sequentially issued by the host after the second patch of data, the (K−2) dies include a third to a $K_{th}$ die, each patch of the third to $K_{th}$ patches of data contains L pages, and the third to $K_{th}$ patches of data are stored to the third to $K_{th}$ dies, respectively,
wherein:
in any die between the third to $K_{th}$ dies, L pages contained in the corresponding patch of data are written to N planes in an interleaved way, and each plane uses one block to provide M pages sharing the same word line to store M pages of data.

14. The method as claimed in claim 13, further comprising:
writing a $(K+1)_{th}$ patch of data that contains L pages to another L pages of the first die, wherein the $(K+1)_{th}$ patch of data is issued by the host after the $K_{th}$ patch of data.

15. The method as claimed in claim 11, further comprising:
writing L pages scattered in N blocks in different planes of one die in one shot with each block providing M pages sharing the same word line.

16. The method as claimed in claim 11, wherein:
the flash memory provides multiple level cells to store data and each word line is shared by two pages within the same block.

17. The method as claimed in claim 16, wherein:
N, the number of planes within each die, is 2; and
K, the number of dies, is 4.

18. The method as claimed in claim 11, wherein:
the flash memory provides triple level cells to store data and each word line is shared by three pages within the same block.

19. The method as claimed in claim 18, wherein:
N, the number of planes within each die, is 2; and
K, the number of dies, is 4.

20. The method as claimed in claim 11, wherein:
the controller writes each die in a z-shaped manner or a serrated-shaped manner.

* * * * *